(12) United States Patent
Cummings

(10) Patent No.: US 6,755,132 B1
(45) Date of Patent: Jun. 29, 2004

(54) REGISTRATION PIN SYSTEM

(75) Inventor: Calvin D. Cummings, Surrey (CA)

(73) Assignee: Creo Inc., Burnaby (CA)

(*) Notice: Subject to any disclaimer, the term of this patent is extended or adjusted under 35 U.S.C. 154(b) by 0 days.

(21) Appl. No.: 10/347,834

(22) Filed: Jan. 22, 2003

(51) Int. Cl.[7] .................................................. B41F 1/34
(52) U.S. Cl. .................... 101/485; 101/477; 101/415.1; 101/DIG. 36
(58) Field of Search .................. 101/486, DIG. 36, 101/415.1, 477, 481, 248

(56) References Cited

U.S. PATENT DOCUMENTS

| | | | | |
|---|---|---|---|---|
| 4,485,447 A | * | 11/1984 | Ericsson | 101/DIG. 36 |
| 5,666,881 A | * | 9/1997 | Zanoli | 701/477 |
| 6,002,495 A | * | 12/1999 | Rombult et al. | 358/488 |
| 6,097,475 A | * | 8/2000 | Jakul et al. | 355/72 |
| 6,321,651 B1 | * | 11/2001 | Tice et al. | 101/248 |
| 6,481,349 B2 | * | 11/2002 | Jehring et al. | 101/415.1 |
| 6,604,465 B2 | * | 8/2003 | Tice et al. | 101/415.1 |
| 2002/0011164 A1 | * | 1/2002 | Tice et al. | 101/382.1 |

* cited by examiner

Primary Examiner—Eugene H. Eickholt
(74) Attorney, Agent, or Firm—Oyen Wiggs Green & Mutala

(57) ABSTRACT

A surface for a plate handling machine is movable in a plate handling direction relative to the plate handling machine. The surface has at least two groups of stops. The stops permit various arrangements of plates to be registered on the surface. Two smaller-sized plates or one larger-sized plate can be registered on the surface. An example surface has a first stop positioned on the surface in a range of 80–90 centimeters in a first lateral direction from a plane parallel to the plate handling direction which bisects surface, a second stop positioned on the surface in a range of 60–70 centimeters in the first lateral direction from the plane, a third stop positioned on the surface in a range of 30–40 centimeters in the first lateral direction from the plane, a fourth stop positioned on the surface in a range of 30–40 centimeters in a second lateral direction opposite the first lateral direction from the plane, a fifth stop positioned on the surface in a range of 60–70 centimeters in the second direction from the plane and a sixth stop positioned on the surface in a range of 80–90 centimeters in the second direction from the plane. The third and fourth stops are positioned approximately on a reference line located on the surface perpendicular to the plate handling direction. The second and fifth stops are offset by a first distance from the reference line in the plate handling direction, and the first and sixth stops are offset by a second distance from the reference line in the plate handling direction, wherein the first distance is greater than the second distance.

21 Claims, 5 Drawing Sheets

REGISTRATION PIN SYSTEM

TECHNICAL FIELD

This invention relates to printing, and in particular to registering printing plates on a plate handling machine such as a platesetter or other printing-related device.

BACKGROUND

In the printing industry it is common to wish to impart an image to a printing plate. Generally, one edge of the printing plate is used as a registration edge. The registration edge is used as a reference to properly align the printing plate on a plate handling machine such as a printing press or a platesetting machine. Typically, a plate is aligned on a drum of a plate handling machine by bringing its registration edge into contact with two registration pins or "stops". The drums of plate handling machines may have a number of stops projecting from them so that printing plates of various sizes can be registered on the drums.

Examples of plate handling machines equipped with such stops include the CREO™ Computer-to-Plate (CTP) imaging systems which include a drum 8 with four stops 10A through 10D, as shown in FIG. 1. Drum 8 preferably comprises a right circular cylinder configured to rotate such that stops 10A through 10D are carried in a plate handling direction indicated by arrow 9. Stop 10A is positioned on a reference line 11 which is parallel to the axis of rotation of drum 8. Stops 10B–D are each offset from reference line 11 so that stops 10B through 10D lead stop 11A as drum 8 rotates. Throughout the description and claims, when a first object on a drum is said to "lead" a second object, it is to be understood that the first object passes a stationary line parallel to the axis of rotation of drum 8 before the second object as drum 8 rotates as indicated by arrow 9, provided that the first object is circumferentially separated from the second object by less than one half of a circumference of the drum. Stop 10D is positioned approximately on reference line 11 such that it leads reference line 11 by approximately 30 microns or less. Stop 10C is positioned to lead reference line 11 by approximately 250 microns. Stop 10B is positioned to lead reference line 11 by approximately 350 microns.

The arrangement of pins shown in FIG. 1 permits multiple different sizes of plates to be registered using the same arrangement of stops, as shown in FIG. 2. Small-sized plates 12A can be properly registered on stops 10A and 10B. Medium-sized plates 12B can be properly registered on stops 10A and 10C. Large-sized plates 12C can be properly registered on stops 10A and 10D. All plates are loaded so that they span between stop 10A and one of stops 10B, 10C and 10D depending upon the width of the plate. An edge detect strip (not shown) may be positioned parallel to reference line 11 on drum 8 to determine the lateral position of a plate.

Stops 10A through 10D are spread apart across the width of drum 8 in such a manner that there are no "dead bands" between the maximum plate width for one pair of stops and the minimum plate width for the "next" pair of stops. Thus, stops 10A through 10D allow for registration of plates with a continuous range of widths.

Despite the success of the systems shown in FIGS. 1 and 2, there is a need for systems capable of imaging a broader range of plate sizes.

SUMMARY OF INVENTION

The invention provides a surface for supporting a printing plate in a plate handling machine. The surface and the plate handling machine are movable in a plate handling direction relative to each other. The surface comprises a plurality of stops, the plurality of stops comprising a pair of central stops and at least two distal stops, wherein the pair of central stops are positioned along a reference line perpendicular to the plate handling direction and wherein each distal stop is offset from the reference line.

The plurality of stops may comprise a first group of stops and a second group of stops, each of the first and second groups of stops comprising one of the pair of central stops and at least one distal stop. The first and second groups of stops are preferably symmetrical with respect to a plane of symmetry which is perpendicular to the reference line.

The surface may be located on a drum connected to a drive mechanism configured to rotate the drum in a circumferential plate handling direction. The central stops preferably lead the distal stops as the drive mechanism rotates the drum in the circumferential plate handling direction.

The stops may project approximately 3 millimeters from the surface. The stops may alternatively be retractable from a position projecting approximately 3 millimeters from the surface to a position not extending from the surface.

The invention also provides a drum for a plate handling machine, the drum having a surface and configured to rotate about an axis of rotation. The drum comprises a plurality of stops on the surface of the drum, the plurality of stops comprising a pair of central stops and at least two distal stops. The pair of central stops are positioned along a reference line parallel to the axis of rotation of the drum and each distal stop is offset from the reference line. The distal stops are preferably offset from the reference line in the same direction. The distal stops are preferably offset from the reference line by a distance in a range of 5 to 1000 microns.

The drum may comprise a first stop positioned on the surface of the drum in a range of 80–90 centimeters in a first direction from a plane which bisects the drum perpendicular to the axis, a second stop positioned on the surface of the drum in a range of 60–70 centimeters in the first direction from the plane, a third stop positioned on the surface of the drum in a range of 30–40 centimeters in the first direction from the plane, a fourth stop positioned on the surface of the drum in a range of 30–40 centimeters in a second direction from the plane, wherein the second direction is opposite the first direction, a fifth stop positioned on the surface of the drum in a range of 60–70 centimeters in the second direction from the plane and a sixth stop positioned on the surface of the drum in a range of 80–90 centimeters in the second direction from the plane. The third and fourth stops are preferably positioned approximately on a reference line located on the surface of the drum parallel to the axis. The second and fifth stops are preferably offset by a first distance from the reference line in the circumferential direction, and the first and sixth stops are preferably offset by a second distance from the reference line in the circumferential direction, wherein the first distance is greater than the second distance.

The surface may comprise a first stop positioned on the surface in a range of 80–90 centimeters in a first lateral direction from a plane parallel to the plate handling direction which perpendicularly bisects the surface, a second stop positioned on the surface in a range of 60–70 centimeters in the first lateral direction from the plane, a third stop positioned on the surface in a range of 30–40 centimeters in the first lateral direction from the plane, a fourth stop positioned on the surface in a range of 30–40 centimeters in a second lateral direction from the plane, wherein the second lateral direction is opposite the first direction, a fifth stop positioned on the surface in a range of 60–70 centimeters in the second lateral direction from the plane and a sixth stop positioned on the surface in a range of 80–90 centimeters in the second lateral direction from the plane. The third and fourth stops are preferably positioned approximately on a reference line located on the surface and perpendicular to the plane. The second and fifth stops are preferably offset by a first distance from the reference line in the plate handling direction, and the first and sixth stops are preferably offset by a second distance from the reference line in the plate handling direction, wherein the first distance is greater than the second distance.

The invention also provides a method of mounting printing plates on the surface or drum disclosed herein. The method may comprise mounting a pair of smaller-sized plates on the stops, wherein each of the pair of smaller-sized plates spans one of the pair of central stops and one of the distal stops, removing the pair of smaller-sized plates from the surface and mounting a single larger-sized plate on the stops, wherein the single larger-sized plate spans the pair of central stops. The method may also comprise mounting a single larger-sized plate on the stops, wherein the single larger-sized plate spans the pair of central stops, removing single larger-sized plate from the surface and mounting a pair of smaller-sized plates on the stops, wherein each of the pair of smaller-sized plates spans one of the pair of central stops and one of the distal stops.

BRIEF DESCRIPTION OF DRAWINGS

In drawings which illustrate non-limiting embodiments of the invention.

DESCRIPTION

Throughout the following description, specific details are set forth in order to provide a more thorough understanding of the invention. However, the invention may be practiced without these particulars. In other instances, well known elements have not been shown or described in detail to avoid unnecessarily obscuring the invention. Accordingly, the specification and drawings are to be regarded in an illustrative, rather than a restrictive, sense.

Figure 1:
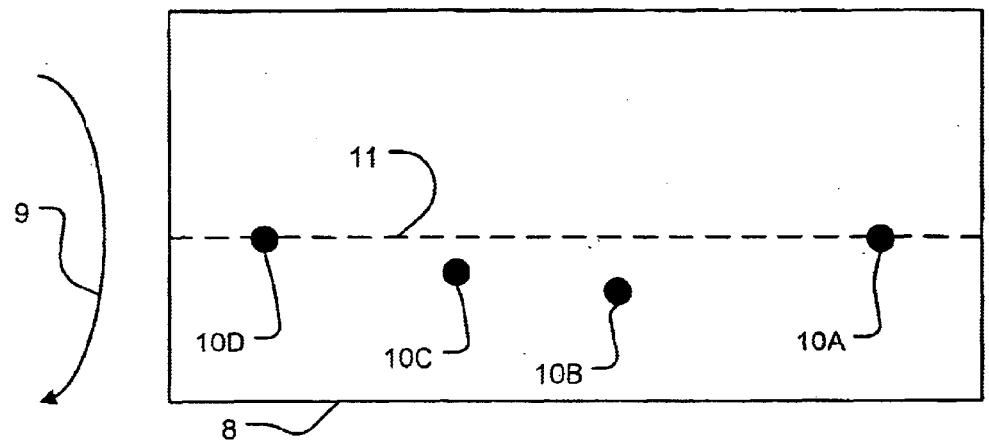
FIG. 1 shows a prior art drum with stops on the surface thereof.
Figure 2:
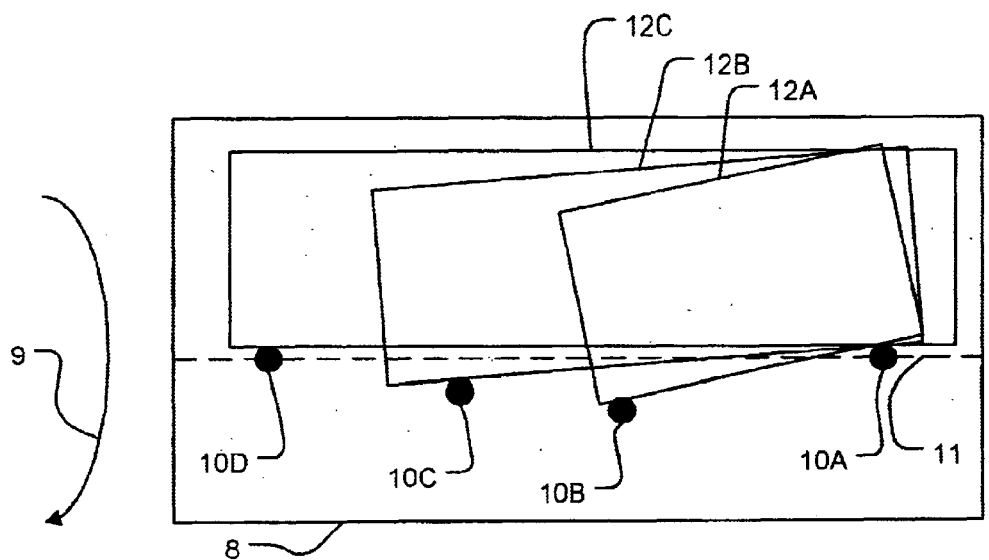
FIG. 2 illustrates various printing plates positioned on the drum of FIG. 1.
Figure 3:
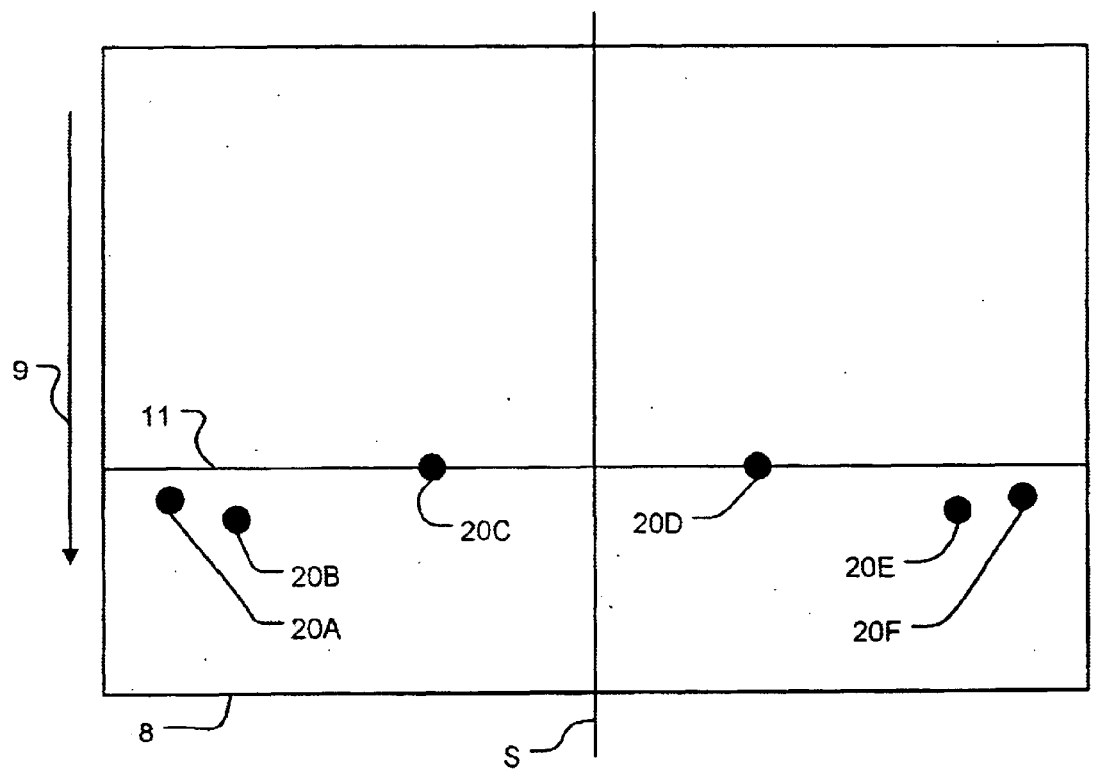
FIG. 3 shows a drum with stops on the surface thereof according to a preferred embodiment of the invention.

The inventors have determined that it is desirable to provide a plate handling machine with a set of stops which allow for placement of two plates on the plate handling machine at the same time. Preferably, the stops are located so that they permit a single larger-sized plate to be loaded on the same set of stops. This reduces the amount of time spent loading the plate handling machine. The inventors have determined that by providing two groups of stops on a drum, as shown in FIG. 3, two plates of various sizes can be handled at the same time. Furthermore, larger plates can be handled by placing the larger plates so that they span the two groups of stops.

Figure 3A:
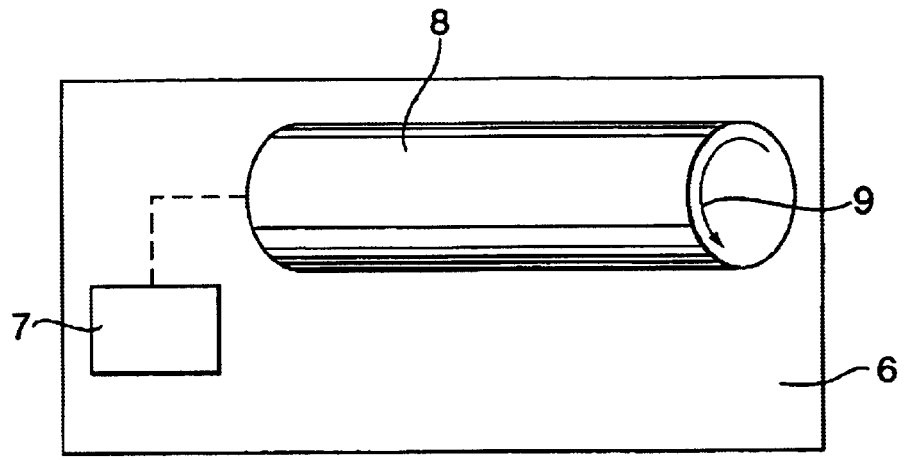
FIG. 3A shows a plate handling machine according to the invention.

In the embodiment of FIG. 3 the stops comprise pins which project from a drum 8. In FIG. 3A, drum 8 is shown in a plate handling machine 6. The surface of drum 8 and plate handling machine 6 are moveable in a plate handling direction 9 relative to each other. A drive mechanism 7 is configured to rotate drum 8. The pins on drum 8 (not shown in FIG. 3A) are organized, as shown in FIG. 3, such that larger plates can span pairs of pins in the two groups while still contacting only two pins along their long registration edges. The embodiment of the invention shown in FIG. 3 provides six stops 20A through 20F spaced across drum 8. Drum 8 is configured to rotate such that stops 20A through 20F are carried in the direction indicated by arrow 9. Stops 20A through 20C comprise a first group of stops. Stops 20D through 20F comprise a second group of stops. Preferably, the first group of stops is positioned symmetrically to the second group of stops, relative to a plane of symmetry S. Plane of symmetry S is preferably perpendicular to the axis of rotation of drum 8. Plane of symmetry S preferably passes approximately through the center of drum 8.

Stops 20C and 20D are preferably positioned approximately on a reference line 11. Reference line 11 is parallel to the axis of rotation of drum 8 and located on the surface of drum 8. Stops 20A, 20B, 20E and 20F are positioned to lead stops 20C and 20D, and are offset from reference line 11 by predetermined distances. The predetermined distances are preferably in the range of 5 to 1000 microns. In the FIG. 3 embodiment, stops 20B and 20E are offset from reference line 11 by a somewhat larger distance than are stops 20A and 20F. The precise distances by which stops 20A, 20B, 20E and 20F are offset from reference line 11 are matters of design convenience and will be determined in part by the specific sizes of plates expected to be registered on drum 8 and the axial locations of the stops on drum 8.

Stops 20C and 20D are referred to as "central" stops, since they are the stops closest to plane of symmetry S. Stops 20A, 20B, 20E and 20F are referred to as "distal" stops, since they are not the stops closest to plane of symmetry S.

The distances of stops 20A through 20F from plane of symmetry S will be determined by the specific sizes of plates expected to be registered on drum 8. By way of example only, stops 20C and 20D may each be positioned in the range of 30–40 centimeters from plane of symmetry S. Stops 20B and 20E may each be positioned in the range of 60–70 centimeters from plane of symmetry S. Stops 20A and 20F may each be positioned in the range of 80–90 centimeters from plane of symmetry S.

Figure 4:
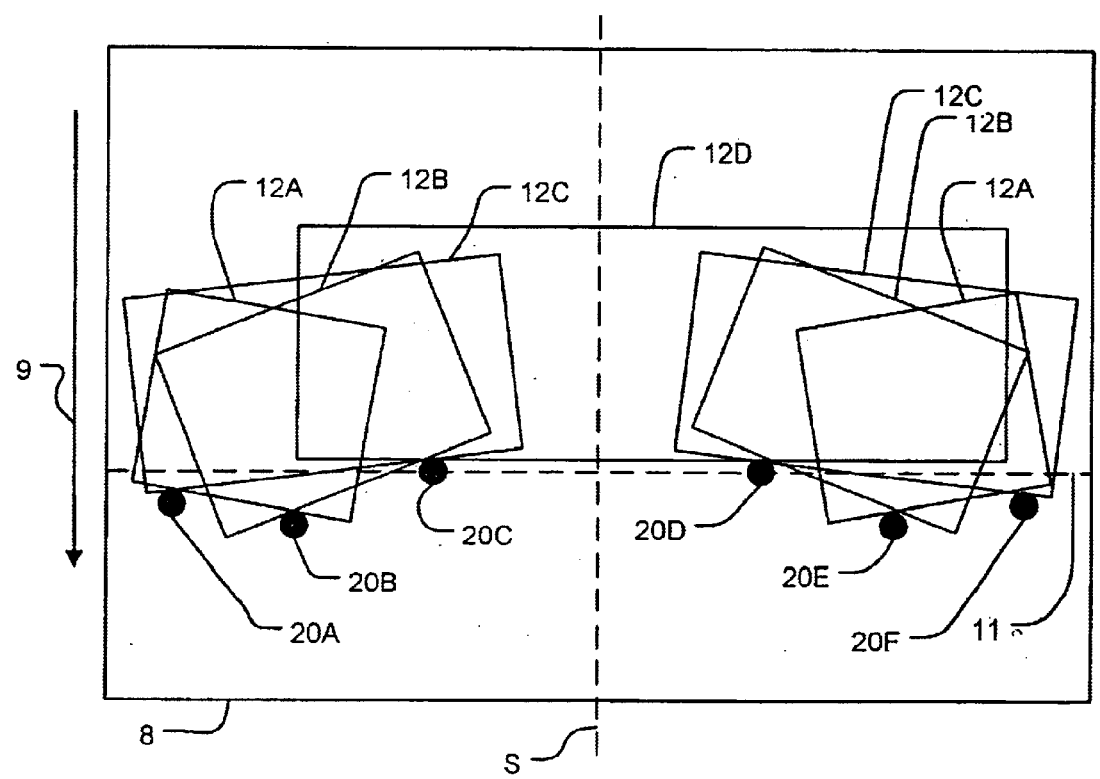
FIG. 4 illustrates various printing plates positioned on the drum of FIG. 3; and, FIG. 5 shows a drum with stops on the surface thereof according to another embodiment of the invention, and illustrates various printing plates positioned on the drum.

Each of the first and second groups of stops can register a variety of sizes of plates, as shown in FIG. 4. Also, a single larger-sized plate may be registered across the first and second groups. As shown in FIG. 4, each plate, when registered, contacts only two stops on its registration edge. A pair of small-sized plates 12A can be properly registered with one small-sized plate 12A on stops 20A and 20B, and another small-sized plate 12A on stops 20E and 20F. Pairs of medium-sized plates 12B can be properly registered with one medium-sized plate 12B on stops 20B and 20C, and another medium-sized plate 12B on stops 20D and 20E. Pairs of large-sized plates 12C can be properly registered with one large-sized plate 12C on stops 20A and 20C, and another large-sized plate 12C on stops 20D and 20F. Still larger-sized plates 12D can be placed so that they span the first and second groups of stops, and can be properly registered on stops 20C and 20D. Generally, when two plates are to be registered at the same time, they will be the same size, but it is to be understood that two plates of different sizes could be registered simultaneously on the first and second groups of stops, respectively.

An edge sensor which may work in conjunction with an edge detect strip (not shown) extending parallel to reference line 11 on drum 8, is preferably provided to determine the lateral position of the plates. Alternatively, additional stops may be provided to permit the plates to be precisely located at predetermined axial positions.

When two plates are registered on drum 8 in the embodiment of FIGS. 3 and 4, they are skewed in opposite senses. For example, one medium-sized plate 12B registered on stops 20B and 20C is skewed in a counterclockwise sense relative to the view shown in FIG. 4, while the other medium-sized plate 12B is skewed in a clockwise sense. Skewing of the plates may be compensated for by adjusting the orientation of the image applied to the plates by a variety of well known techniques, including, but not limited to digital reorganization of the image data. While any amount of skewing may be compensated for, it is desirable to limit the skewing of plates to avoid problems with clamping the plates in position, and to avoid lengthening the imaging time.

Figure 3B:
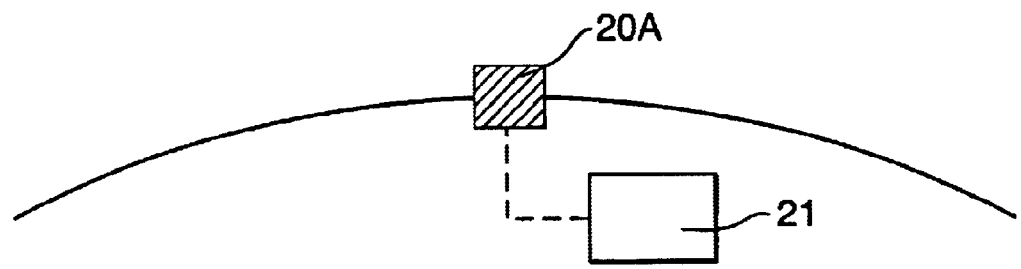
FIGS. 3B and 3C depict cross-sectional views of a portion of a drum having a retractable stop in its protruding and retracted states respectively.
Figure 3C:
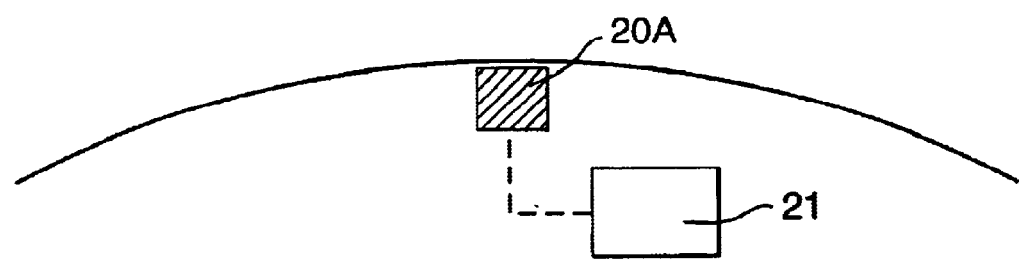

Stops 20A through 20F preferably protrude approximately 3 millimeters radially outward from the surface of drum 8. Stops 20A through 20F may be fixed in position, or may be capable of being retracted radially inward or otherwise removed when they are not being used. FIGS. 3B and 3C depict a portion of a drum 8 having a retractable stop 20A. In FIG. 3B, stop 20A is in a position such that it protrudes radially outward from the surface of drum 8. In FIG. 3C, stop 20A is in a retracted position, such that it does not protude radially outward from the surface of drum 8. Stop 20A is actuated by actuation mechanism 21.

When moving a plate from one plate handling machine to another plate handling machine, for example from a plate imaging machine to a printing press, it is desirable to register the plate by bringing the same portions of the plate's registration edge against stops on each of the different machines. This helps to ensure that the plate will line-up properly.

Figure 5:
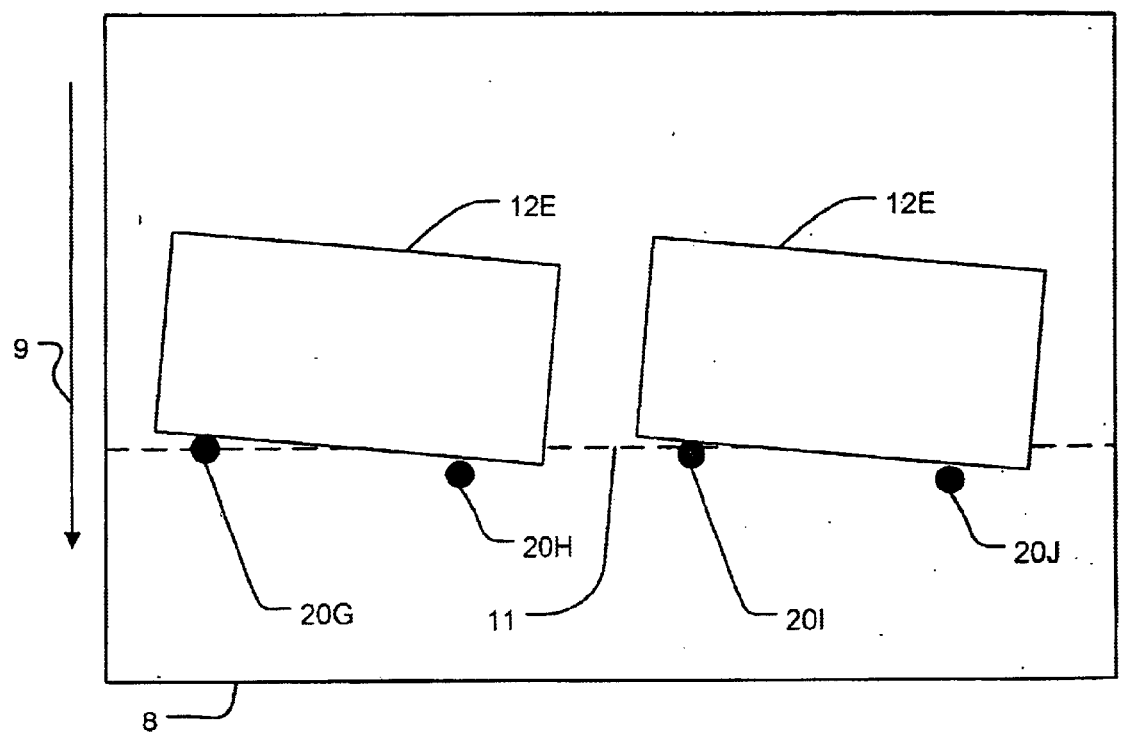

As shown in FIG. 5, in an alternative version of the invention, registration pins are located so that two plates can be loaded on the drum with the two plates both skewed in the same sense. Stops 20G and 20I are positioned on reference line 11, and stops 20H and 20J are positioned to lead reference line 11. Two plates 12E may be loaded on drum 8 so that they are skewed in the same sense. The embodiment of FIG. 5 also permits larger plates to be registered by spanning between stops 20H and 20I.

In a further alternative embodiment of the invention, a flat-bed plate handling machine is provided with stops arranged in the same pattern as stops 20A through 20F to facilitate registration of plates on the flat-bed machine. Likewise, a flat-bed machine could be provided with stops arranged in the same pattern as stops 20G through 20J.

As will be apparent to those skilled in the art in the light of the foregoing disclosure, many alterations and modifications are possible in the practice of this invention without departing from the spirit or scope thereof. Accordingly, the scope of the invention is to be construed in accordance with the substance defined by the following claims.

What is claimed is:

1. A surface for supporting a printing plate in a plate handling machine, the surface and the plate handling machine movable in a plate handling direction relative to each other, the surface comprising a pair of central stops positioned along a reference line perpendicular to the plate handling direction and for each of the central stops, the surface comprising a corresponding plurality of distal stops positioned in locations offset from the reference line, wherein each plurality of distal stops comprises an outermost distal stop that is offset from the reference line by a first offset distance and an intermediate stop, located between the outermost stop and the corresponding central stop, that is offset from the reference line by a second offset distance and wherein the first offset distance is smaller than the second offset distance.

2. The surface of claim 1 wherein the plurality of distal stops corresponding to a first central stop and the plurality of distal stops corresponding to a second central stop are symmetrical with respect to a plane of symmetry which is perpendicular to the reference line.

3. The surface of claim 1 wherein the surface is located on a drum connected to a drive mechanism configured to rotate the drum in a circumferential plate handling direction.

4. The surface of claim 2 wherein the surface is located on a drum connected to a drive mechanism configured to rotate the drum in a circumferential plate handling direction.

5. A surface for supporting a printing plate in a plate handling machine, the surface and the plate handling machine movable in a plate handling direction relative to each other, the surface located on a drum connected to a drive mechanism configured to rotate the drum in a circumferential plate handling direction, the surface comprising a plurality of stops, the plurality of stops comprising a pair of central stops and at least two distal stops, the pair of central stops positioned along a reference line perpendicular to the plate handling direction and each distal stop positioned in a location offset from the reference line wherein the central stops lead the distal stops as the drive mechanism rotates the drum in the circumferential plate handling direction.

6. A surface according to claim 5, wherein a pair of plates is registrable on the surface such that one edge of a first plate abuts against a first one of the central stops and at least one of the distal stops and one edge of a second plate abuts against a second one of the central stops and at least one of the distal stops.

7. A surface for supporting a printing plate in a plate handling machine, the surface and the plate handling machine movable in a plate handling direction relative to each other, the surface located on a drum connected to a drive mechanism configured to rotate the drum in a circumferential plate handling direction, the surface comprising a plurality of stops, the plurality of stops comprising a pair of central stops and at least two distal stops, the pair of central stops positioned along a reference line perpendicular to the plate handling direction and each distal stop positioned in a location offset from the reference line, wherein the plurality of stops comprises a first group of stops and a second group of stops, each of the first and second groups of stops comprising one of the pair of central stops and at least one distal stop, wherein the first and second groups of stops are symmetrical with respect to a plane of symmetry which is perpendicular to the reference line and wherein the central stops lead the distal stops as the drive mechanism rotates the drum in the circumferential plate handling direction.

8. A surface for supporting a printing plate in a plate handling machine, the surface and the plate handling machine movable in a plate handling direction relative to each other, the surface comprising a plurality of stops, the plurality of stops comprising a pair of central stops and at least two distal stops, the pair of central stops positioned along a reference line perpendicular to the plate handling direction and each distal stop positioned in a location offset from the reference line, wherein the stops project approximately 3 millimeters from the surface.

9. A surface for supporting a printing plate in a plate handling machine, the surface and the plate handling machine movable in a plate handling direction relative to each other, the surface comprising a plurality of stops, the plurality of stops comprising a pair of central stops and at least two distal stops, the pair of central stops positioned along a reference line perpendicular to the plate handling direction and each distal stop positioned in a location offset from the reference line, wherein the stops are retractable from a position projecting approximately 3 millimeters from the surface to a position not extending from the surface.

10. A drum for a plate handling machine, the drum having a surface and configured to rotate about an axis of rotation, the drum comprising a pair of central stops positioned along a reference line parallel to the axis of rotation of the drum and for each of the central stops, the drum comprising a corresponding plurality of distal stops positioned in locations offset from the reference line, wherein each plurality of distal stops comprises an outermost distal stop that is offset from the reference line by a first offset distance and an intermediate stop, located between the outermost stop and the corresponding central stop, that is offset from the reference line by a second offset distance and wherein the first offset distance is smaller than the second offset distance.

11. The drum of claim 10 wherein all of the distal stops are offset from the reference line in the same direction.

12. A drum for a plate handling machine, the drum having a surface and configured to rotate about an axis of rotation, the drum comprising a plurality of stops on the surface of the drum, the plurality of stops comprising a pair of central stops and at least two distal stops, the pair of central stops positioned alone a reference line parallel to the axis of rotation of the drum and each distal stop positioned in a location offset from the reference line wherein the distal stops are offset from the reference line in the same direction by a distance in a range of 5 to 1000 microns.

13. A drum according to claim 12, wherein a pair of plates is registrable on the surface such that one edge of a first plate abuts against a first one of the central stops and at least one of the distal stops and one edge of a second plate abuts against a second one of the central stops and at least one of the distal stops.

14. A drum for a plate handling machine, the drum having a surface and being configured to rotate in a circumferential direction about an axis, the drum comprising:
   a first stop positioned on the surface of the drum in a range of 80–90 centimeters in a first direction from a plane which bisects the drum perpendicular to the axis;
   a second stop positioned on the surface of the drum in a range of 60–70 centimeters in the first direction from the plane;
   a third stop positioned on the surface of the drum in a range of 30–40 centimeters in the first direction from the plane;
   a fourth stop positioned on the surface of the drum in a range of 30–40 centimeters in a second direction from the plane, wherein the second direction is opposite the first direction;
   a fifth stop positioned on the surface of the drum in a range of 60–70 centimeters in the second direction from the plane; and,
   a sixth stop positioned on the surface of the drum in a range of 80–90 centimeters in the second direction from the plane,
   wherein the third and fourth stops are positioned approximately on a reference line, the reference line located on the surface of the drum parallel to the axis, and wherein the second and fifth stops are offset by a first distance from the reference line in the circumferential direction, and the first and sixth stops are offset by a second distance from the reference line in the circumferential direction, wherein the first distance is greater than the second distance.

15. The drum of claim 14 wherein the stops project approximately 3 millimeters radially outward from the surface of the drum.

16. The drum of claim 14 wherein the stops are retractable from a position in which they project approximately 3 millimeters radially outward from the surface of the drum to a position in which they do not project from the surface of the drum.

17. A surface for a plate handling machine, the surface and the plate handling machine configured to move in a plate handling direction relative to each other, the surface comprising:
   a first stop positioned on the surface in a range of 80–90 centimeters in a first lateral direction from a plane parallel to the plate handling direction which perpendicularly bisects the surface;
   a second stop positioned on the surface in a range of 60–70 centimeters in the first lateral direction from the plane;
   a third stop positioned on the surface in a range of 30–40 centimeters in the first lateral direction from the plane;
   a fourth stop positioned on the surface in a range of 30–40 centimeters in a second lateral direction from the plane, wherein the second lateral direction is opposite the first direction;
   a fifth stop positioned on the surface in a range of 60–70 centimeters in the second lateral direction from the plane; and,
   a sixth stop positioned on the surface in a range of 80–90 centimeters in the second lateral direction from the plane,
   wherein the third and fourth stops are positioned approximately on a reference line, the reference line located on the surface and perpendicular to the plane, and wherein the second and fifth stops are offset by a first distance from the reference line in the plate handling direction, and the first and sixth stops are offset by a second distance from the reference line in the plate handling direction, wherein the first distance is greater than the second distance.

18. A method of mounting printing plates on a surface in a plate handling machine, the surface and the plate handling machine movable in a plate handling direction relative to each other, the surface comprising a plurality of stops, the plurality of stops comprising a pair of central stops and at least two distal stops, the pair of central stops positioned along a reference line perpendicular to the plate handling direction and each distal stop positioned in a location offset from the reference line, the method comprising:
   mounting a pair of smaller-sized plates on the stops, wherein each of the pair of smaller-sized plates spans one of the pair of central stops and one of the distal stops;
   removing the pair of smaller-sized plates from the surface; and, mounting a single larger-sized plate on the stops, wherein the single larger-sized plate spans the pair of central stops.

19. A method of mounting printing plates on a drum of a plate handling machine, the drum having a surface and configured to rotate about an axis of rotation, the drum comprising a plurality of stops on the surface of the drum, the plurality of stops comprising a pair of central stops and at least two distal stops, the pair of central stops positioning along a reference line parallel to the axis of rotation of the drum and each distal stop positioned in a location offset from the reference line, the method comprising:

mounting a pair of smaller-sized plates on the stops, wherein each of the pair of smaller-sized plates spans one of the pair of central stops and one of the distal stops;

removing the pair of smaller-sized plates from the surface; and, mounting a single larger-sized plate on the stops, wherein the single larger-sized plate spans the pair of central stops.

20. A method of mounting printing plates on a surface in a plate handling machine, the surface and the plate handling machine movable in a plate handling direction relative to each other, the surface comprising a plurality of stops, the plurality of stops comprising a pair of central stops and at least two distal stops, the pair of central stops positioned along a reference line perpendicular to the plate handling direction and each distal stop positioned in a location offset from the reference line, the method comprising:

mounting a single larger-sized plate on the stops, wherein the single larger-sized plate spans the pair of central stops;

removing single larger-sized plate from the surface; and, mounting a pair of smaller-sized plates on the stops, wherein each of the pair of smaller-sized plates spans one of the pair of central stops and one of the distal stops.

21. A method of mounting printing plates on a drum of a plate handling machine, the drum having a surface and configured to rotate about an axis of rotation, the drum comprising a plurality of stops on the surface of the drum, the plurality of stops comprising a pair of central stops and at least two distal stops, the pair of central stops positioned along a reference line parallel to the axis of rotation of the drum and each distal stop positioned in a location offset from the reference line, the method comprising:

mounting a single larger-sized plate on the stops, wherein the single larger-sized plate spans the pair of central stops;

removing single larger-sized plate from the surface; and, mounting a pair of smaller-sized plates on the stops, wherein each of the pair of smaller-sized plates spans one of the pair of central stops and one of the distal stops.

* * * * *